United States Patent
Erozlu et al.

(10) Patent No.: US 12,146,753 B2
(45) Date of Patent: Nov. 19, 2024

(54) SMART ELECTRIC VEHICLE TRIP PLANNER ALGORITHM

(71) Applicant: Rivian IP Holdings, LLC, Irvine, CA (US)

(72) Inventors: Murat Erozlu, North Vancouver (CA); Vignesh Eswar, Santa Ana, CA (US); Calvin Ka Wai Ching, Richmond (CA); Kok Wei Koh, Mountain View, CA (US); Martin Hermez, West Bloomfield, MI (US); Jason Meyer Quint, Ann Arbor, MI (US); Parinaz Sayyah, Los Gatos, CA (US)

(73) Assignee: Rivian IP Holdings, LLC, Irvine, CA (US)

( * ) Notice: Subject to any disclaimer, the term of this patent is extended or adjusted under 35 U.S.C. 154(b) by 41 days.

(21) Appl. No.: 17/558,345

(22) Filed: Dec. 21, 2021

(65) Prior Publication Data

US 2023/0038012 A1    Feb. 9, 2023

Related U.S. Application Data

(60) Provisional application No. 63/226,732, filed on Jul. 28, 2021.

(51) Int. Cl.
| | |
|---|---|
| G01C 21/00 | (2006.01) |
| B60L 58/12 | (2019.01) |
| G01C 21/34 | (2006.01) |
| G01C 21/36 | (2006.01) |
| G01R 31/382 | (2019.01) |

(52) U.S. Cl.
CPC .......... *G01C 21/3469* (2013.01); *B60L 58/12* (2019.02); *G01C 21/3679* (2013.01); *G01R 31/382* (2019.01)

(58) Field of Classification Search
CPC . G01C 21/3469; G01C 21/3679; B60L 58/12; G01R 31/382
See application file for complete search history.

(56) References Cited

U.S. PATENT DOCUMENTS

| | | | |
|---|---|---|---|
| 2014/0046595 A1* | 2/2014 | Segawa | G01C 21/34 701/400 |
| 2017/0138750 A1* | 5/2017 | Weber | G01C 21/3679 |

(Continued)

FOREIGN PATENT DOCUMENTS

WO    WO-2013172157 A1 * 11/2013 ......... G01C 21/3469

OTHER PUBLICATIONS

Machine Translation WO 2013172157 (year:2013).*

(Continued)

*Primary Examiner* — Anne Marie Antonucci
*Assistant Examiner* — Jordan T Smith
(74) *Attorney, Agent, or Firm* — Haley Guiliano LLP

(57) ABSTRACT

Systems and methods are provided for suggesting a charging station for an electric vehicle. A partial range of the electric vehicle corresponding to a predetermined percentage of the current state of charge of a battery of the electric vehicle is determined. A location corresponding to the partial range, along a route to a destination, is determined and used to select a suggested charging station based on the location corresponding to the partial range. The suggested charging station is generated for presentation at a display.

20 Claims, 6 Drawing Sheets

(56) References Cited

U.S. PATENT DOCUMENTS

2020/0333148 A1* 10/2020 Qiu .................... G01C 21/3476
2021/0389145 A1* 12/2021 Liu ........................... B60L 3/12
2024/0094017 A1* 3/2024 Baum ................ G01C 21/3697
2024/0151545 A1* 5/2024 Hashimoto ............. B60L 58/13

OTHER PUBLICATIONS

A Better Routeplanner, https://abetterrouteplanner.com/ (retrieved on Jun. 15, 2022).
Charge Trip, https://chargetrip.com/ (retrieved on Jun. 15, 2022).
Tesla's Trip Planner, https://tesla.com/trips (retrieved on Jun. 15, 2022).

* cited by examiner

SMART ELECTRIC VEHICLE TRIP PLANNER ALGORITHM

CROSS-REFERENCE TO RELATED APPLICATION

This application claims priority to U.S. Provisional Patent Application No. 63/226,732, filed on Jul. 28, 2021, the entire contents of which are hereby expressly incorporated by reference in their entirety.

INTRODUCTION

Many electric vehicles include an electric battery that must be charged periodically at a charging station to enable the electric battery to power the electric vehicle. As the popularity of electric vehicles continues to grow, more and more charging stations are being built to accommodate such charging of electric vehicles. However, it may be difficult for a driver of an electric vehicle to identify a suitable electric charging station for his or her electric vehicle while traveling to a driving destination from among such a multitude of options.

SUMMARY

In one approach, a navigation interface is presented to the driver of an electric vehicle suggesting one or more charging stations along a route to a destination based on, e.g., pre-calculated values based on historical data. For example, charging stations may be suggested when a state of charge (SOC) of the electric battery of the electric vehicle drops or is projected to drop below some minimum value (e.g., 10% of the total capacity of the electric battery). However, in such an approach, it may be difficult to predict when charging stations should be suggested—especially if sufficient historical data is not available. Thus, unnecessary charging stations may be added to a route. Consequently, what is needed are techniques to accurately suggest only necessary charging stops and optimize charging time at suggested charging stops, without primarily relying on historical data.

In some embodiments, to solve one or more of these problems, systems and methods are provided to improve suggestions of charging stations based on a route to a destination by determining a partial range of an electric vehicle corresponding to a predetermined percentage (e.g., 80%) of a current SOC of a battery of the electric vehicle and determining whether a navigation destination is within the determined partial range.

In some embodiments, to solve one or more of these problems, systems and methods are provided to improve suggestions of charging stations along a route to a destination by determining a partial range of an electric vehicle corresponding to a predetermined percentage (e.g., 80%) of a current SOC of a battery of the electric vehicle and determining whether a navigation destination is within the determined partial range in order to determine whether to add charging stations as waypoints along a route to the destination. By adding charging stations as a function of a partial range determined as a percentage of the current SOC (e.g., instead of relying on a fixed minimum value of the total capacity of the electric battery), unnecessary charging stops may be avoided (e.g., especially for short trips).

In accordance with the present disclosure, systems and methods are provided for suggesting a charging station for an electric vehicle, and may include a display and processing circuitry configured to determine a partial range of the electric vehicle corresponding to a predetermined percentage of a current SOC of a battery of the electric vehicle, determine, along a route to a destination, a location corresponding to the partial range, select a suggested charging station based on the location corresponding to the partial range, and generate for presentation, at a display, the suggested charging station.

In some embodiments, the processing circuitry may be further configured to determine whether the destination is within the partial range, and in response to determining that the destination is out of the partial range, perform the determination of the location corresponding to the partial range, the selection of the suggested charging station, and the generation for presentation, at the display, the suggested charging station.

In some embodiments, the processing circuitry may be further configured to determine a partial recharge range of the electric vehicle from the suggested charging station corresponding to the predetermined percentage of a predetermined recharge SOC of the battery, and determine whether the destination is within the partial recharge range from a location of the suggested charging station. In response to determining the destination is within the partial recharge range from the location of the suggested charging station, the processing circuitry may be further configured to determine a period of time for recharging the battery in order to reach the destination with a predetermined destination SOC of the battery, and generate for display, at the display, the suggested charging station with the destination recharge time.

In some embodiments, the predetermined percentage may be 80%, the predetermined recharge SOC of the battery may be 80% of a total capacity of the battery, and the predetermined destination SOC of the battery may be 25% of the total capacity of the battery.

In some embodiments, the processing circuitry may be further configured to determine a partial recharge range of the electric vehicle from the suggested charging station corresponding to the predetermined percentage of a predetermined recharge SOC of the battery, and determine whether the destination is within the partial recharge range from the suggested charging station.

In response to determining the destination is out of the partial recharge range from the location of the suggested charging station, the processing circuitry may be further configured to determine, along the route to the destination, an additional location corresponding to the partial recharge range, select an additional suggested charging station based on the additional location corresponding to the partial recharged range, and generate for display, at the display, the additional suggested charging station.

In some embodiments, the processing circuitry may be further configured to retrieve route information of the route, and, when determining the partial range of the electric vehicle and the partial recharge range of the electric vehicle, to determine the partial range of the electric vehicle and the partial recharge range of the electric vehicle further based the retrieved route information of the route.

In some embodiments, the retrieved route information of the route may include at least one of weather information along the route, speed information along the route, traffic information along the route, or elevation change along the route.

In some embodiments, the processing circuitry may be further configured, when generating for presentation the suggested charging station, to generate for presentation the route including the suggested charging station as a waypoint.

In some embodiments, the processing circuitry may be further configured, when selecting the suggested charging station, to search for charging stations within a predetermined distance from the location corresponding to the partial range, and, in response to identifying at least one charging station based on a result of the searching, select the suggested charging station from among the at least one charging stations based on a distance of the at least one charging station from the location corresponding to the partial range and attributes of the at least one charging station.

BRIEF DESCRIPTION OF THE DRAWINGS

The above and other objects and advantages of the present disclosure will be apparent upon consideration of the following detailed description, taken in conjunction with the accompanying drawings, in which like reference characters refer to like parts throughout, and in which.

DETAILED DESCRIPTION

Figure 1:
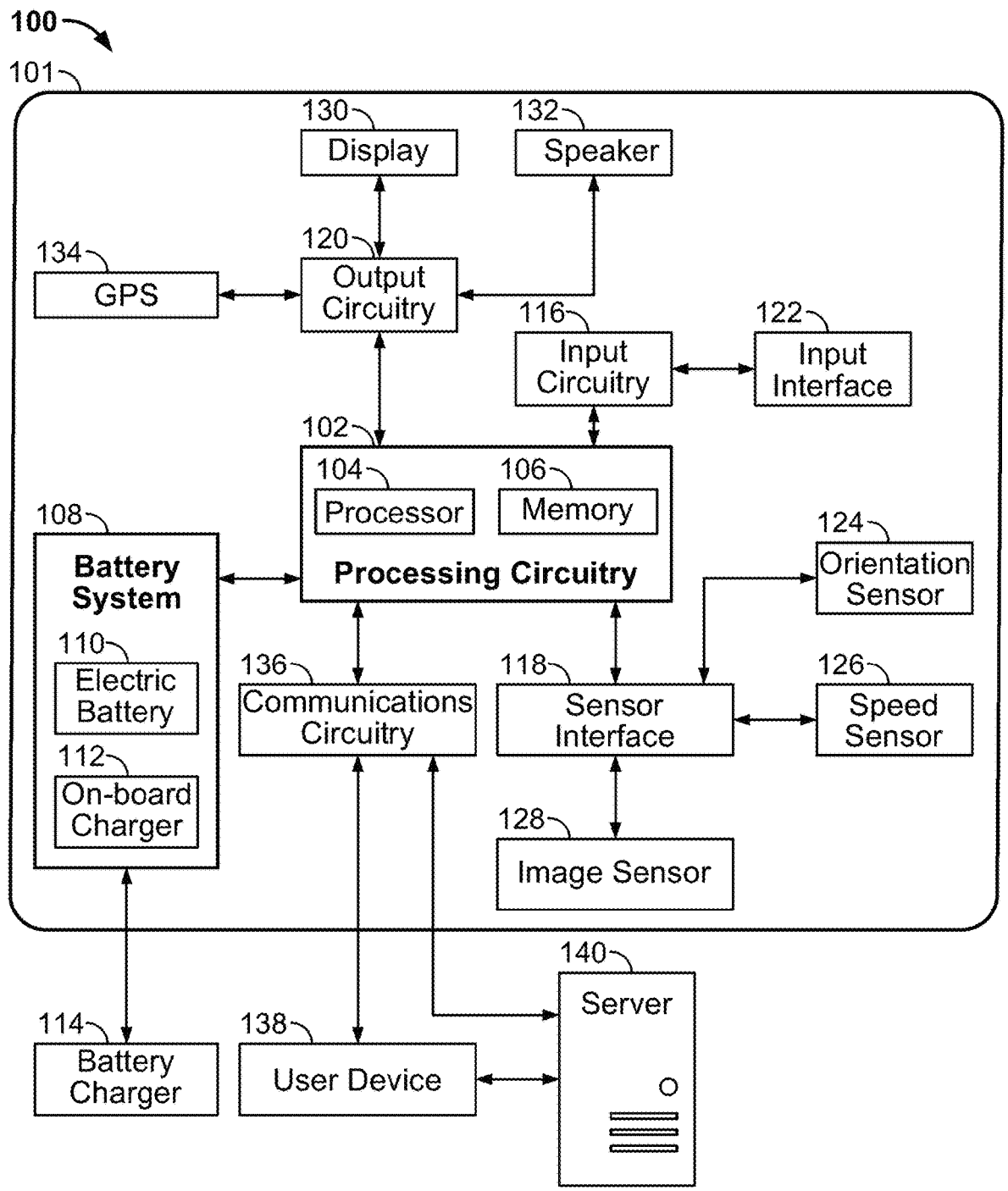
FIG. 1 shows a block diagram of components of a system of an electric vehicle for providing, to an occupant of the electric vehicle, suggested charging stations and recharge durations for recharging the electric vehicle on a route to a destination, in accordance with some embodiments of the present disclosure.

FIG. 1 shows a block diagram of components of a system 100 of electric vehicle 101 for providing, to an occupant of electric vehicle 101 (e.g., the driver), suggested charging stations and recharge durations for recharging electric vehicle 101 on a route to a destination, in accordance with some embodiments of the present disclosure. Electric vehicle 101 may be a car (e.g., a coupe, a sedan, a truck, an SUV, a bus), a motorcycle, an aircraft (e.g., a drone), a watercraft (e.g., a boat), or any other type of vehicle.

Electric vehicle 101 may comprise processing circuitry 102, which may comprise processor 104 and memory 106. Processor 104 may comprise a hardware processor, a software processor (e.g., a processor emulated using a virtual machine), or any combination thereof. In some embodiments, processor 104 and memory 106 in combination may be referred to as processing circuitry 102 of electric vehicle 101. In some embodiments, processor 104 alone may be referred to as processing circuitry 102 of electric vehicle 101. Memory 106 may comprise hardware elements for non-transitory storage of commands or instructions, that, when executed by processor 104, cause processor 104 to operate electric vehicle 101 in accordance with embodiments described above and below. Processing circuitry 102 may be communicatively connected to components of electric vehicle 101 via one or more wires, or via wireless connection.

Processing circuitry 102 may be communicatively connected to battery system 108, which may be configured to provide power to one or more of the components of electric vehicle 101 during operation. In some embodiments, electric vehicle 101 may be an electric vehicle or a hybrid electric vehicle. Battery system 108 may comprise electric battery 110, which may include one or more battery modules. In some embodiments, electric battery 110 may be a 180 kWh battery pack or a 135 kWh battery pack. Battery system 108 may further comprise on-board charger 112 to manage the flow of electricity to electric battery 110 (e.g., to perform AC-DC conversion when battery charger 114 is an AC charger), and any other suitable components. In some embodiments, on-board charger 112 may include connectors for interfacing with battery charger 114. Battery system 108 may be configured to manage charging of electric battery 110, which may include measuring one or more characteristics of electric battery 110, identifying if a fault has occurred, providing power to components of electric vehicle 101, communicating with battery charger 114, any other suitable actions, or any combination thereof. Battery system 108 may include, for example, electrical components (e.g., switches, bus bars, resistors, capacitors), control circuitry (e.g., for controlling suitable electrical components), and measurement equipment (e.g., to measure voltage, current, impedance, frequency, temperature, or another parameter). Battery system 108 may provide charge status information to processing circuitry 102. Charge status information includes, for example, charge level (e.g., a state-of-charge (SOC), whether the battery is being charged, charging current, charging voltage, charging mode, and whether a charging fault exists.

In some embodiments, electric vehicle 101 may be plugged, or otherwise connected to, battery charger 114 via a cable (e.g., having a SAE J1772 charging plug, a CCS connector, etc.), having more than one conductor of suitable gauge. Such cable may include conductors for carrying charging current and conductors for transmitting information. It will be understood that any suitable arrangement of leads may be used in accordance with the present disclosure.

Battery charger 114 may be coupled to a power source, e.g., a power transmission grid, a solar panel, a generator, a wind turbine, or another vehicle, and may be configured to provide charging current at a suitable charging voltage to electric battery 110 of electric vehicle 101. In some embodiments, battery charger 114 may correspond to a charger at a DC station (e.g., DC fast electric charging station) or AC station. Battery charger 114 may be, for example, a fixed charging station (e.g., a charging station installed in a public location or in a user's home), or a portable charger (e.g., a charger connected to a portable generator, a portable solar panel, or another vehicle). In some embodiments, battery charger 114 may be capable of charging electric battery 110 at one or more voltages, with one or more current limitations. For example, battery charger 114 may receive information from battery system 108 indicating what voltage, current, or both, electric vehicle 101 may be charged with. Battery charger 114 may provide a charging current that is limited by one or more constraints. For example, electric vehicle 101 may communicate to battery charger 114 what charging current is desired for charging. In a further example, a cable type may have a maximum associated current capacity based on insulation and heat transfer considerations. In some embodiments, battery charger 114 and on-board charger 112, support both the inflow and outflow of current from electric battery 110 via a coupling. For example, during vehicle to vehicle charging or vehicle to grid power supply, battery charger 114 and/or on-board charger 112 may direct power from electric battery 110 to a power source coupled to battery charger 114, such as a battery of another vehicle or an electric power grid.

Image sensor 128 (e.g., a camera) may be communicatively coupled to processing circuitry 102 (e.g., by way of sensor interface 118) and positioned at any suitable position in an interior or exterior of electric vehicle 101. In some embodiments, image sensor 128 may capture images of destinations traveled to by electric vehicle 101 to identify driving habits of electric vehicle 101. Processing circuitry 102 may be communicatively connected to input interface 122 (e.g., a steering wheel, a touch screen display, buttons, knobs, a microphone or other audio capture device, etc.) via input circuitry 116. In some embodiments, a driver of electric vehicle 101 may be permitted to select certain settings in connection with the operation of electric vehicle 101 (e.g., input a range selection, etc.). In some embodiments, processing circuitry 102 may be communicatively connected to Global Positioning System (GPS) system 134 of electric vehicle 101, where the driver may interact with the GPS system via input interface 122. GPS system 134 may be in communication with multiple satellites to ascertain the vehicle's location and provide navigation directions to processing circuitry 102. As another example, the positioning device may operate on terrestrial signals, such as cell phone signals, Wi-Fi signals, or ultra-wideband signals to determine a location of electric vehicle 101. The determined location may be in any suitable form such as a geographic coordinate, a street address, a nearby landmark such as an identification of the nearest charging station or a tagged location associated with the vehicle (e.g., a location of a home of the user stored in memory 106). In some embodiments, processing circuitry 102 uses the determined location to identify whether the vehicle is within a threshold range of a tagged location (e.g., is within a certain range from a charging station). In some embodiments, battery system 108 may utilize the determined location to identify whether battery charger 114 is a home charging station or a non-home charging station (e.g., a public charging station, another vehicle, a generator, etc.).

Processing circuitry 102 may be communicatively connected to display 130 and speaker 132 by way of output circuitry 120. Display 130 may be located at a dashboard of electric vehicle 101 and/or a heads-up display at a windshield of electric vehicle 101. For example, an interface for GPS system 134 or an interface of an infotainment system may be generated for display, and display 130 may comprise an LCD display, an OLED display, an LED display, or any other type of display. In some embodiments, display 130 may provide a driver with intermediate charging range information and estimated charge time information based on information output by battery system 108. Speaker 132 may be located at any location within the cabin of electric vehicle 101, e.g., at the dashboard of electric vehicle 101, on an interior portion of the vehicle door. In some embodiments, speaker 132 may be configured to provide audio alerts related to intermediate charging range information and estimated charge time information based on information output by battery system 108.

Processing circuitry 102 may be communicatively connected (e.g., by way of sensor interface 118) to orientation sensor 124, which may be an inclinometer, an accelerometer, a tiltmeter, any other pitch sensor, or any combination thereof and may be configured to provide vehicle orientation values (e.g., vehicle's pitch and/or vehicle's roll) to processing circuitry 102. Speed sensor 126 may be one of a speedometer, a GPS sensor, or the like, or any combination thereof, and may be configured to provide a reading of the vehicle's current speed to processing circuitry 102.

In some embodiments, processing circuitry 102 may be in communication (e.g., via communications circuitry 136) with user device 138 (e.g., a mobile device, a computer, a key fob, etc.). Such connection may be wired or wireless. In some embodiments, user device 138 may execute instructions stored in memory to run a map interface application, e.g., to provide information related to electric charging stations for charging electric vehicle 101. In some embodiments, communications circuitry and/or user device 138 may be in communication with one or more servers 140 (e.g., over a communications network such as, for example, the Internet), which may be configured to provide information related to electric charging stations, information that can be used to determine driving range (e.g., elevation maps), charging locations, weather information, and/or mapping or GPS information to electric vehicle 101 and/or user device 138, and provide an updated display based on user inputs.

It should be appreciated that FIG. 1 only shows some of the components of electric vehicle 101, and it will be understood that electric vehicle 101 also includes other elements commonly found in vehicles (e.g., electric vehicles), e.g., a motor, brakes, wheels, wheel controls, turn signals, windows, doors, etc.

Figure 2:
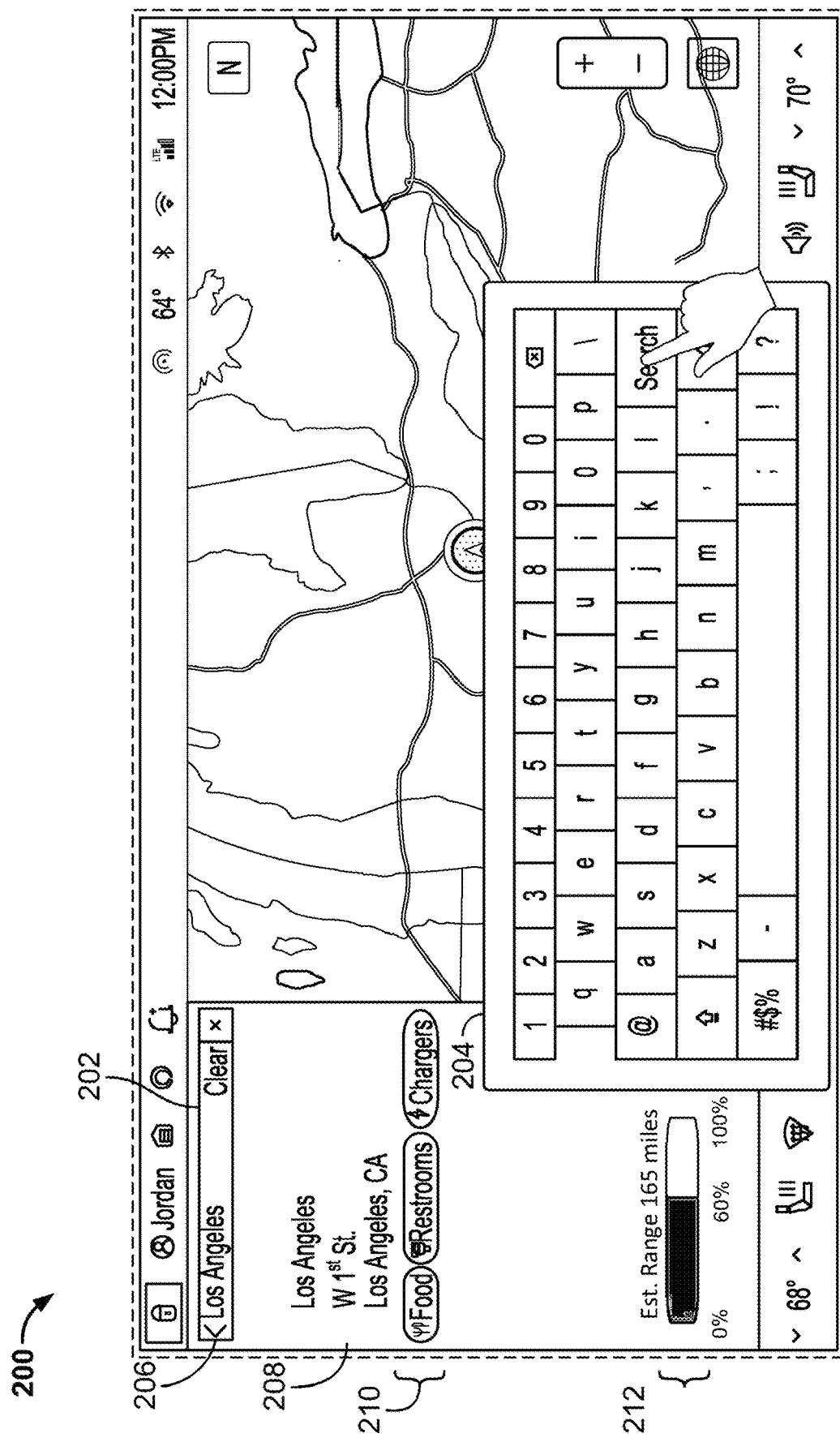
FIG. 2 shows an exemplary navigation interface for entering a desired destination, in accordance with some embodiments of the present disclosure.

FIG. 2 shows an exemplary navigation interface 200 for entering a desired destination, in accordance with some embodiments of the present disclosure. Navigation interface 200 may be generated for display, by way of processing circuitry 102 and output circuitry 120, at an in-vehicle infotainment screen of display 130 (e.g., a heads-up display and/or at one or more dashboard displays depicting graphical user interfaces) and/or at a display of user device 138 of an occupant of electric vehicle 101 (e.g., a driver). In some embodiments, navigation interface 200 may be displayed in response to receiving a selection of an icon from a different interface screen. Search bar 202 may be selected by the occupant of the vehicle (e.g., a driver) to toggle keyboard 204 for entering a search query.

In some embodiments, navigation interface 200 may display user-selectable icons 210 for one or more categories (e.g., food, restrooms, charging). In response to user selection of one of user-selectable icons 210, navigation interface 200 may present icons corresponding to identified locations of destinations corresponding to the selected category that are each selectable as the desired destination. For example, in response to a user selecting icon 210 for "Food," navigation interface 200 may display icons representing establishments serving food in an area around a current location of electric vehicle 101. In some embodiments, navigation interface 200 may display user-selectable icons for one or more recent destinations of the driver (or electric vehicle 101). In response to a user selection of one of user-selectable icons, navigation interface 200 may generate and display a route to the selected destination, as described in further detail below. In some embodiments, it may be advantageous to predict a destination that the driver (or electric vehicle 101) is likely to travel to by analyzing a schedule of the driver or a schedule associated with electric vehicle 101.

In some embodiments, navigation interface 200 may display icon 212 representing the current SOC of electric battery 110 of electric vehicle 101 based on information output by battery system 108. For example, as shown, icon 212 may indicate the current SOC as a percentage ("60%") of the total capacity of electric battery 110. In some embodiments, icon 212 may also indicate an estimated range ("165 miles") based on the current SOC. As explained in further detail below, the estimated range may be refined based on retrieved route information (e.g., speed limits, elevation change, traffic, weather, etc.) once a destination is selected and a route to the destination is determined.

As shown, a user may enter search query 206 ("Los Angeles") in search bar 202, using displayed keyboard 204. In response to search query 206, processing circuitry 102 may identify a destination 208 ("Los Angeles, W 1$^{st}$ St., Los Angeles, Calif.") corresponding to search query 206 and display the identified destination 208 on navigation interface 200. Automatically or in response to a user selection of destination 208, navigation interface 300 may be generated for display, by way of processing circuitry 102 and output circuitry 120, at an in-vehicle infotainment screen of display 130 (e.g., a heads-up display and/or at one or more dashboard displays depicting graphical user interfaces) and/or at a display of user device 138 of the driver of electric vehicle 101, as shown in FIG. 3.

Figure 3:
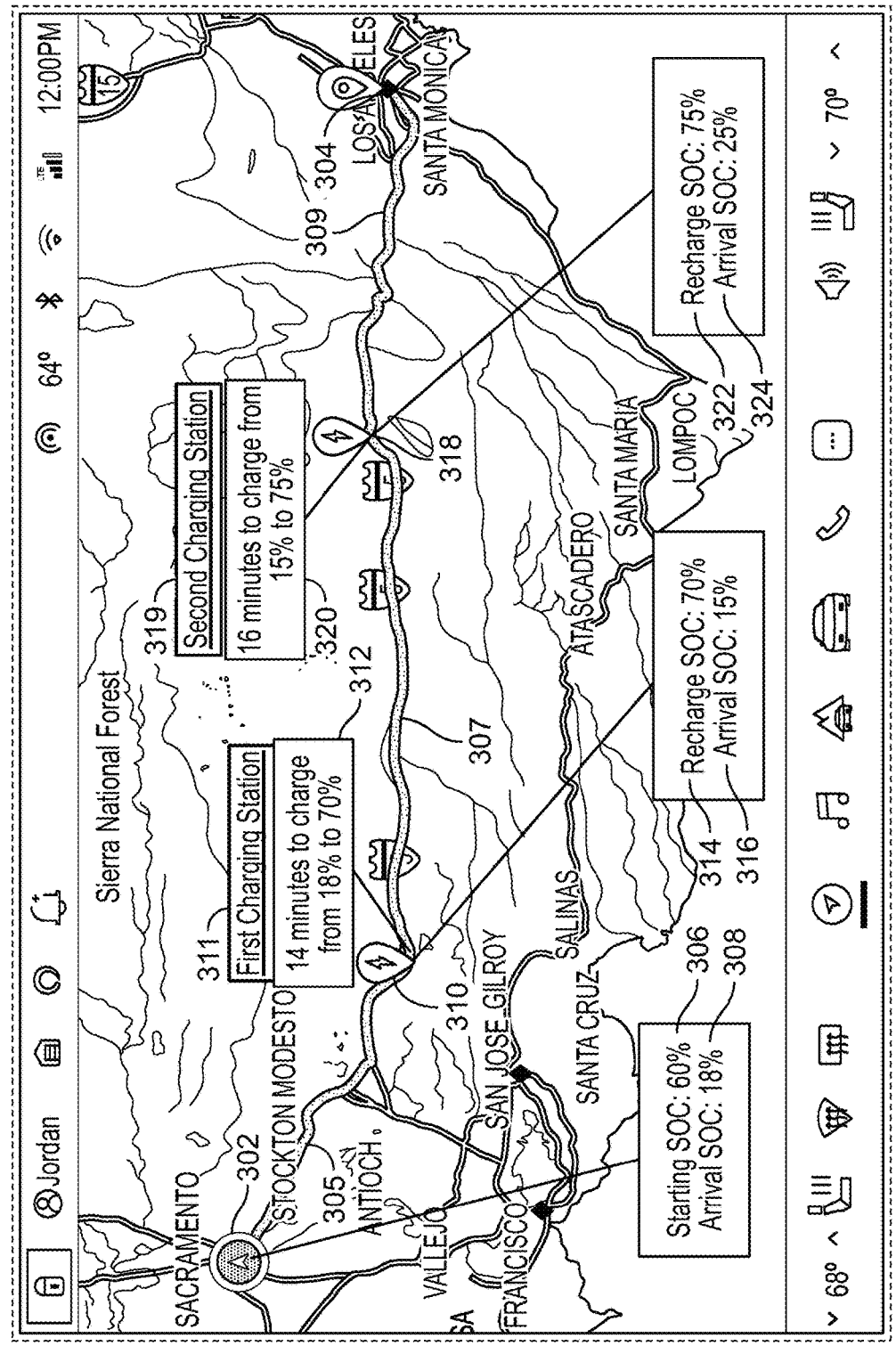
FIG. 3 shows an exemplary navigation interface for navigating to a destination, in accordance with some embodiments of the present disclosure.

FIG. 3 shows an exemplary navigation interface 300 for navigating to destination 208, in accordance with some embodiments of the present disclosure. As shown, navigation interface 300 may comprise a suggested route from indicator 302 of the current location ("Sacramento") of the electric vehicle 101 to indicator 304 of destination 208 ("Los Angeles"). The suggested route may include first route portion 305 from the current location of the electric vehicle 101 to indicator 310 of first charging station 311, second route portion 307 from indicator 310 of first charging station 311 to indicator 318 of second charging station 319, and third route portion 309 from indicator 318 of second charging station 319 to indicator 304 of destination 208. Processing circuitry 102 may identify first and second charging stations 311, 319 as described below.

Processing circuitry 102 may determine an initial route from the current location of electric vehicle 101 to destination 208 that does not include any charging stops. Processing circuitry 102 may access route information of the initial route. For example, processing circuitry may access route information from one or more servers 140 (e.g., via communications circuitry 136). The route information may include weather information, elevation information, speed limit information, traffic information or any other suitable information about factors that may affect the range of electric vehicle 101 (e.g., driver behavior).

Processing circuitry 102 may estimate how far along the initial route electric vehicle 101 can travel (e.g., the estimated range), based on the route information and the current SOC of electric battery 110. For example, processing circuitry 102 may adjust the expected range of electric vehicle 101 for the current SOC of electric battery 110 by the route information to determine the estimated range. In order to account for differences between the estimated range and actual range of electric vehicle 101, processing circuitry 102 may determine a partial range corresponding to a predetermined percentage of the current SOC. In one example, the predetermined percentage may be 80% of the current SOC. That is, processing circuitry 102 may determine how far electric vehicle 101 will have traveled when the SOC of electric battery 110 reaches 20% of the original SOC. In some embodiments, the predetermined percentage may be any suitable value within a range (e.g., 70%-90%). In some embodiments, the predetermined percentage may be stored in a driver profile and adjusted over time by comparing determined partial ranges to actual traveled distances. As shown below in Table 1, based on a current SOC ("Starting SOC") of 60%, processing circuitry 102 may determine that the partial range of electric vehicle 101 is 132 miles. That is, processing circuitry 102 may determine that electric vehicle 101 be able to travel 132 miles using 80% of the starting SOC of 60%, which corresponds to when the total capacity of the electric battery 110 reaches 12%.

Processing circuitry 102 may determine if destination 208 is within the partial range. That is, processing circuitry 102 may determine if electric vehicle 101 is expected to reach destination 208 using 80% or less of the current SOC. If processing circuitry 102 determines that electric vehicle 101 is expected to reach destination 208 using 80% or less of the current SOC, navigation interface 300 may display the initial route to destination 208 without any added charging stops. If, however, processing circuitry 102 determines that electric vehicle 101 is not expected to reach destination 208 using 80% or less of the current SOC, processing circuitry 102 identifies a charging station to add as a waypoint to the initial route (e.g., by adjusting the initial route to stop at the charging station). For example, as shown, processing circuitry 102 may compare the determined partial range of 132 miles with the distance to destination 208 (400 miles) to determine that electric vehicle 101 will need to stop at least once to recharge en route to destination 208.

In response to determining that electric vehicle 101 will need to stop and recharge at a charging station, processing circuitry 102 may search for charging stations in the vicinity of a location along the initial route that corresponds to the partial range. That is, processing circuitry 102 may search for charging stations 132 miles into the initial route from the current location. In some embodiments, processing circuitry 102 may search for charging stations within a predetermined range of the location corresponding to the partial range (e.g., within 10 miles in any direction). If processing circuitry 102 identifies multiple charging stations within the predetermined range, processing circuitry 102 may select one of the charging stations based on various factors including charging attributes of identified charging stations, the distance of the identified charging stations from the location corresponding to the partial range, etc. If processing circuitry 102 does not identify any charging stations within the predetermined range, processing circuitry 102 may select the charging station that is closest to the location corresponding to the partial range, while still being within the partial range (e.g., the last charging station along the route before the location corresponding to the partial range). For example, as shown, processing circuitry 102 may select first charging station 311, which is 115 miles into the initial route from the current location. Processing circuitry 102 may determine first route portion 305 based on the location of first charging station 311 (e.g., by modifying the initial route by setting first charging station 311 as the destination for first route portion 305).

Processing circuitry 102 may then repeat the process described above to determine if destination 208 is within range of first charging station 311. To do this, processing circuitry 102 may determine a partial range of electric vehicle 101 based on a predetermined recharge SOC of electric battery 110. The predetermined recharge SOC may be based on charging characteristics of electric battery 110 (e.g., C-Rate). For example, electric battery 110 may charge most quickly between 15% and 80% of the total capacity of electric battery 110. In this case, the predetermined recharge SOC may be set to 80% of the total capacity of electric battery 110. However, this is only an example and the predetermined recharge SOC may be set to any suitable value based on charging characteristics of electric battery 110 (e.g., between 75% and 85% of the total capacity of electric battery 110). As shown below in Table 1, based on the predetermined recharge SOC of 80%, processing circuitry 102 may determine that the partial recharged range of electric vehicle 101 (e.g., based on the predetermined percentage of the predetermined recharge SOC) is 176 miles from the location of first charging station 311. In response to determining that destination 208 is not within the partial recharged range of electric vehicle 101, processing circuitry 101 may search for charging stations 176 miles from first charging station 311. As shown, processing circuitry 102 may identify and select second charging station 319, which is 155 miles from first charging station 311.

Processing circuitry 102 may repeat the process described above to determine if destination 208 is within the partial recharged range of second charging station 319 (e.g., based on the predetermined percentage of the predetermined recharge SOC). For example, as shown below in Table 1, processing circuitry 102 may determine that destination 208 (134 miles away) is within the partial recharged range (172 miles) of second charging station 311 and that no more charging stops are needed.

TABLE 1

| Location | Current Location (Sacramento) | First Charging Station | Second Charging Station | Destination (Los Angeles) |
|---|---|---|---|---|
| Miles | 0 | 115 miles | 266 miles (+151 miles) | 400 miles (+134 miles) |
| Starting SOC | 60% | N/A | N/A | N/A |
| Preliminary Recharge SOC (80%) | N/A | 80% | 80% | N/A |
| Partial Range (80% of SOC) | 132 miles | 176 miles | 172 miles | N/A |

After selecting first and second charging stations 311, 319, processing circuitry 102 may calculate energy consumption for each of the first, second, and third route portions 305, 307, and 309 in order to recommend charging times at each of the first and second charging stations 311, 319 that minimize the duration of the trip to destination 208. For example, it may be advantageous for electric vehicle 101 to arrive at charging stations with around 15% of the total capacity of electric battery 110 (e.g., to maximize charging rate while minimizing charging time during the trip). Additionally, in some embodiments, it may be advantageous for electric vehicle 101 to arrive at destination 208 with around 25% of the total capacity of electric battery 110 (e.g., to provide sufficient range at the desired destination). In some embodiments, the arrival SOC may be adjusted based on user preferences or the availability of chargers at a destination. For example, if charging stations are available at the destination, the arrival SOC may be adjusted to 15%.

Example recommended charge times are shown below in Table 2, as well as FIG. 3. For example, as shown, processing circuitry 102 may set the adjusted arrival SOC for second charging station 319 to 15% of the total capacity of electric battery 110. Based on this adjusted arrival SOC, processing circuitry 102 may determine that the recommended recharge SOC (e.g., the recharge SOC required at first charging station 311 to reach second charging station 319 with 15% SOC) is 70%. Based on charging attributes of first charging station 311 (e.g., provided by one or more servers 140), processing circuitry 102 may determine that it will take 14 minutes of charging time to reach a recharge SOC of 70%. Similarly, based on an adjusted arrival SOC of 25% at destination 208, processing circuitry 102 may determine that the recommended recharge SOC at second charging station 319 is 75%. Based on the charging attributes of second charging station 319, processing circuitry may determine that it will take 16 minutes of charging time to reach a recharge SOC of 75%.

TABLE 2

| Location | Current Location (Sacramento) | First Charging Station | Second Charging Station | Destination (Los Angeles) |
|---|---|---|---|---|
| Miles | 0 | 115 miles | 266 miles (+151 miles) | 400 miles (+134 miles) |
| Starting SOC | 60% | N/A | N/A | N/A |
| Preliminary Arrival SOC | N/A | 18% | 25% | 30% |
| Adjusted Arrival SOC | N/A | N/A | 15% | 25% |
| Recommended Recharge SOC | N/A | 70% | 75% | N/A |
| Recommended Recharge Time | N/A | 14 minutes | 16 minutes | N/A |

As shown, navigation interface 300 may selectively display certain information shown in Tables 1 and 2. For example, navigation interface 300 may display icons for starting SOC 306, recharge SOCs 314, 322, and arrival SOCs 308, 316, and 324. Additionally, navigation interface 300 may display icons 312, 320 in association with first and second charging stations 311, 319. Icons 312, 320 may include the recommended recharge time to recharge electric battery 110 at each of first and second charging stations 311, 319.

Figure 4:
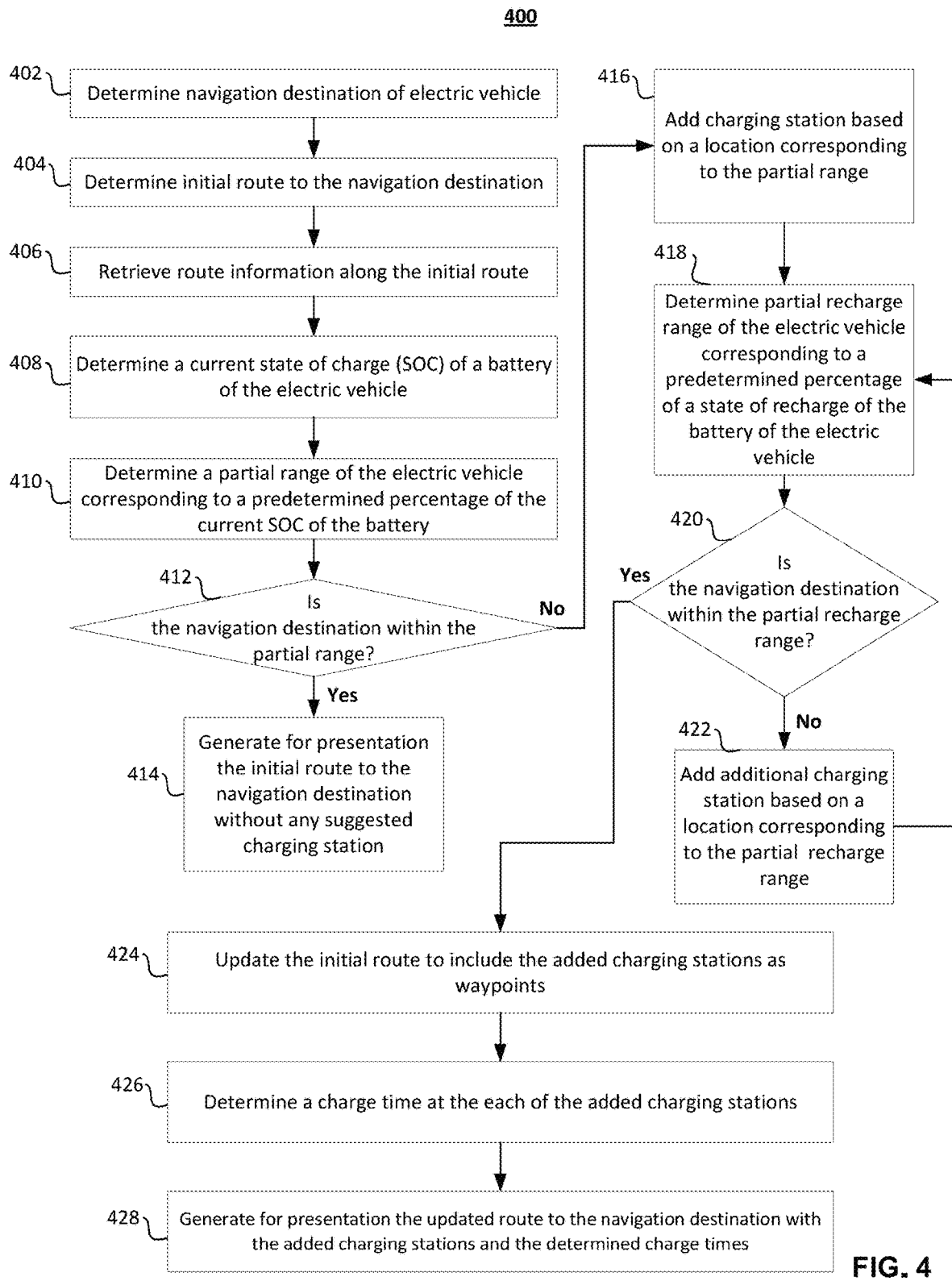
FIG. 4 shows a flowchart of an illustrative process for generating a route to a destination, in accordance with some embodiments of the present disclosure.

FIG. 4 shows a flowchart of illustrative process 400 for generating a route to a destination, in accordance with some embodiments of the present disclosure. Process 400 may be performed at least in part by processing circuitry 102 and/or user device 138.

At 402, processing circuitry 102 may determine a navigation destination. For example, input circuitry 116 may receive a user input or selection of a destination on navigation interface 200. Navigation interface 200 may be displayed at display 130 of electric vehicle 101 and/or at user device 138.

At 404, processing circuitry 102 may determine an initial route to the destination. In some embodiments, processing circuitry 102 may perform this determination based on information received from GPS system 134 and/or one or more servers 140.

At 406, processing circuitry 102 may retrieve route information along the initial route. In some embodiments, processing circuitry 102 may retrieve route details from one or more servers 140. The route information may include weather information, elevation information, speed limit information, traffic information, or any other suitable information about factors that may affect the range of electric vehicle 101.

At 408, processing circuitry 102 may determine a current SOC of electric battery 110 of electric vehicle 101. For example, processing circuitry 102 may retrieve the current SOC of electric battery 110 from battery system 108.

At 410, processing circuitry 102 may determine a partial range of electric vehicle 101 corresponding to a predetermined percentage of the current SOC of the electric battery. In some embodiments, processing circuitry 102 determines the partial range by determining how far along the initial route electric vehicle 101 can travel using only a predetermined percentage (e.g., 80%) of the current SOC of electric battery 110. The partial range may be determined using the route details retrieved in 406. In some embodiments, the processing circuitry 102 determines the partial range by determining the current energy of electric battery 110 and applying a scaling factor as explained further in 406.

At 412, processing circuitry 102 may determine if the destination is within the partial range. In some embodiments, processing circuitry 102 may determine if electric vehicle 101 can travel to the destination using only the predetermined percentage of the current SOC of electric battery 110. In response to determining that the destination is within the partial range ("Yes" at 412), processing may proceed to 414. Otherwise ("No" at 412), processing may proceed to 416. In some embodiments, processing circuitry 102 may determine if the destination is within the partial range by determining if the current energy of electric battery 110 is a predetermined percentage more (e.g., 15%) than the energy required to reach the destination. A predetermined percentage more of 15% corresponds to determining if electric vehicle 101 can travel to the destination using 86.95% (1/1.15%) of the current SOC.

At 414, processing circuitry 102 may generate for presentation the initial route to the destination without any suggested charging station. For example, even if the current SOC is low (e.g., below 15%), processing circuitry 102 will not add a charging station along the route to the destination as long as the destination is within the partial range.

At 416, processing circuitry 102 may add a charging station based on a location corresponding to the partial range. For example, processing circuitry 102 may determine, along the initial route to the destination, a location corresponding to the partial range and search for charging stations around the location. In some embodiments, processing circuitry 102 may search for charging stations within a predetermined range from the location. If processing circuitry 102 does not identify any charging stations within the predetermined range from the location, processing circuitry 102 may search for the charging station that is the farthest along the initial route, before the location. If multiple charging stations are identified, processing circuitry 102 may select one of the charging stations based on charging attributes of the charging stations, the distance of the charging stations from the locations, the distance off the initial route, etc.

At 418, processing circuitry 102 may determine a partial recharged range of the electric vehicle 101 corresponding to a predetermined percentage of a state of recharge of electric battery 110. In some embodiments, the state of recharge is set in advance based on the charging characteristics of electric battery 110 (e.g., 80% of the total capacity of electric battery 110). The predetermined percentage may be the same percentage (e.g., 80%) as discussed at 410.

At 420, processing circuitry 102 may determine if the destination is within the partial recharged range. That is, processing circuitry 102 may determine if electric vehicle 101 can travel to the destination using only the predetermined percentage of the state of recharge of electric battery 110. In response to determining that the destination is within the partial recharged range ("Yes" at 420), processing may proceed to 424. Otherwise ("No" at 420), processing may proceed to 422.

At 422, processing circuitry 102 may add an additional charging station based on a location corresponding to the partial recharged range. For example, processing circuitry 102 may search for and select an additional charging station as discussed above at 416. Processing may then return to 418 to determine if the destination is within range of the additional charging station. 418-422 may be repeated until a charging station is added that is within partial range of the destination.

At 424, processing circuitry 102 may update the initial route to include the added charging stations as waypoints. For example, the route may be updated to travel between the added charging stations en route to the destination.

At 426, processing circuitry 102 may determine a charge time at each of the added charging stations. For example, as described in more detail in connection with FIG. 5, processing circuitry 102 may determine a charge time at each of the added charging stations to minimize the time to the destination.

At 428, processing circuitry 102 may generate for presentation the updated route to the destination with the added charging stations and the determined charge time (e.g., on navigation interface 300). Navigation interface 300 (or any of the other interfaces described above) may be displayed at display 130 of electric vehicle 101 and/or at user device 138.

Figure 5:
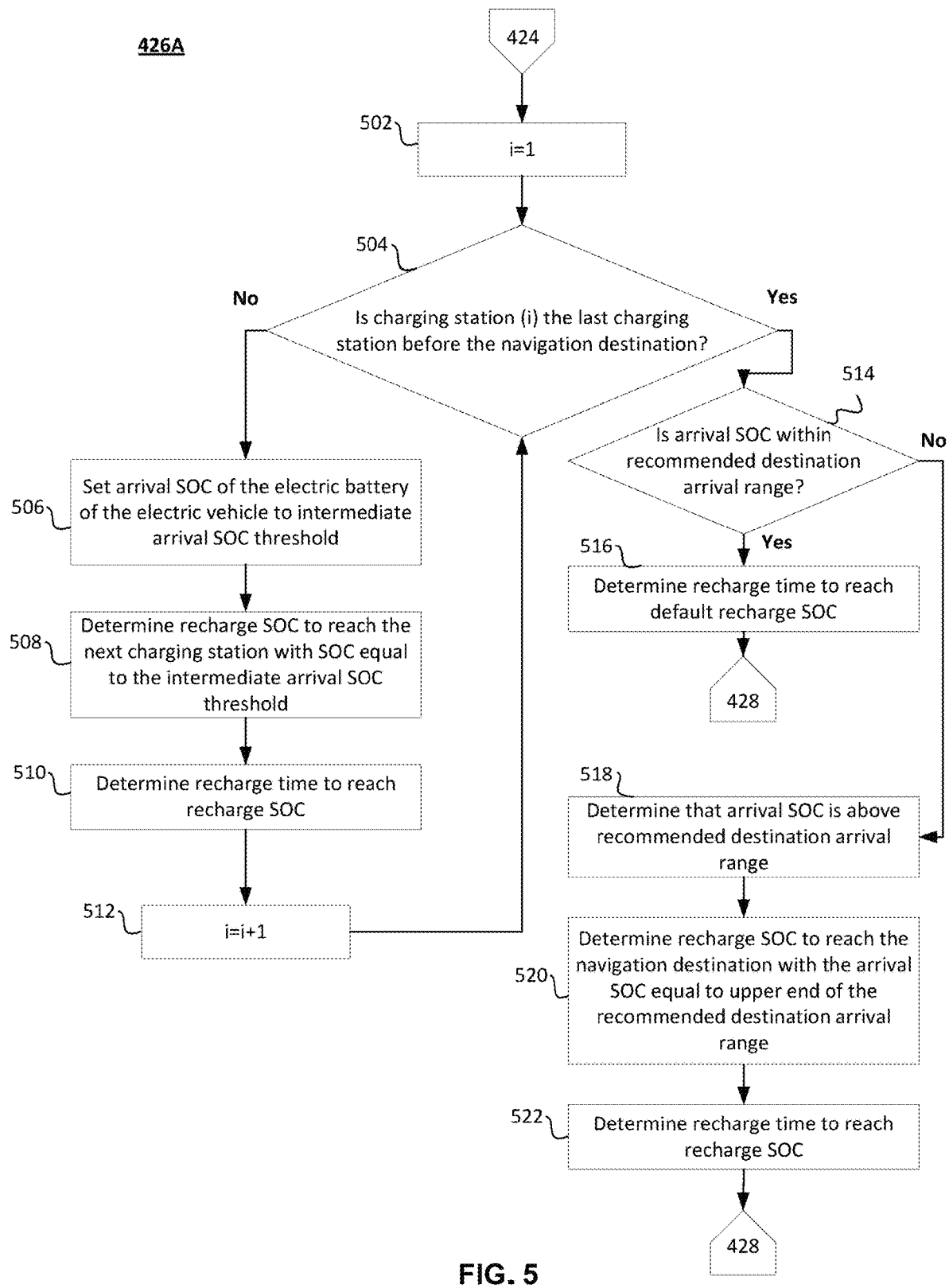
FIG. 5 shows a flowchart of an illustrative process for determining a charge time at each of the added charging stations, in accordance with some embodiments of the present disclosure.

FIG. 5 shows a flowchart of an illustrative process 426A for determining a charge time at each of the added charging stations, in accordance with some embodiments of the present disclosure. Process 426A is one embodiment of a method for performing 426 of FIG. 4 and begins after 424. Process 426A may be performed at least in part by processing circuitry 102 and/or user device 138.

At 502, processing circuitry 102 may set a counter to one (e.g., to determine a recharge time for each of the charging stations added to the route). Although a counter is shown, any suitable method of considering each of the added charging stations may be used.

At 504, processing circuitry determines if the charging station is the last added charging station on the route before the destination. In response to determining that the charging station is not the last charging station on the route before the destination ("No" at 504), processing may proceed to 506. Otherwise ("Yes" at 504), processing may proceed to 514.

At 506, processing circuitry 102 may set an arrival SOC of electric battery 110 of electric vehicle 101 to an intermediate arrival SOC threshold (e.g., a desired SOC when electric vehicle 101 reaches an intermediate charging station). The intermediate arrival SOC threshold may be set based on the charging characteristics of electric battery 110 (e.g., to maximize the rate of charging at the charging station). In one example, the intermediate arrival SOC threshold may be set to 15% of the total capacity of electric battery 110. If the charging station is the first charging station along a route, the arrival SOC is a function of the starting SOC.

At 508, processing circuitry 102 may determine a recharge SOC to reach the next charging station with intermediate arrival SOC threshold. The recharge SOC may be determined based on the expected energy consumption for the route portion (e.g., based on route information).

At 510, processing circuitry 102 may determine a recharge time to reach the recharge SOC. For example, processing circuitry 102 may determine how long it will take to recharge electric battery 110 from the arrival SOC at the current charging station to the recharge SOC.

At 512, processing circuitry 102 may increment the counter and return to 504.

At 514, in response to determining that the charging station is the last charging station before the navigation destination, processing circuitry 102 may determine if the arrival SOC of electric battery 110 of electric vehicle 101 is projected to be within a recommended destination arrival range. In one example, the recommended destination arrival range may be set to 15% to 25% of the total capacity of electric battery 110. In some embodiments, the recommended destination arrival range may be adjusted based on the type of destination, the availability of charging stations at the destination, etc. In response to determining that the arrival SOC of electric battery 110 is projected to be within the recommended destination arrival range ("Yes" at 514), processing may proceed to 516. Otherwise ("No" at 514), processing may proceed to 518.

At 516, processing circuitry 102 may determine a recharge time to reach a default recharge SOC (e.g., a predetermined percentage of a state of recharge of electric battery 110 discussed in 418 of FIG. 4). In one example, the default recharge SOC is 80% of the total capacity of electric battery 110.

At 518, processing circuitry 102 may determine that the arrival SOC is above the recommended destination arrival range. In should be understood that processing only reaches 518 if the arrival SOC is above the recommended arrival range.

At 520, processing circuitry 102 may determine a recharge SOC to reach the destination with an arrival SOC equal to the upper end of the recommended destination arrival range. The recharge SOC may be determined based on the expected energy consumption for the route portion (e.g., based on route information). By reducing to recharge SOC to reach the destination with only an arrival SOC equal to the upper end of the recommended destination arrival range (e.g., and not above this value), charging time during the trip may be reduced.

At 522, processing circuitry 102 may determine a recharge time to reach the recharge SOC. For example, processing circuitry 102 may determine how long it will take to recharge electric battery 110 from the arrival SOC at the current charging station to the recharge SOC.

Figure 6:
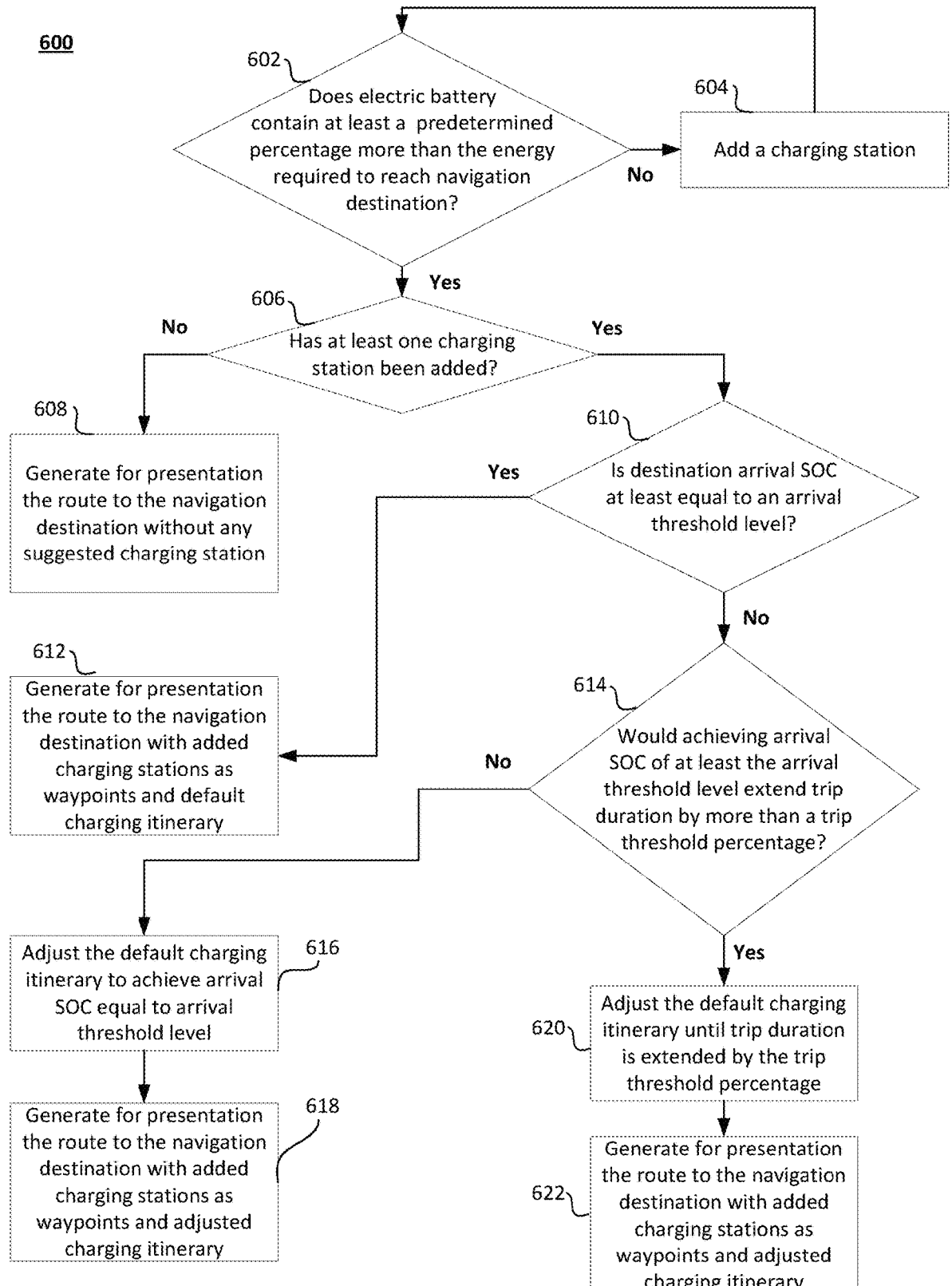
FIG. 6 shows a flowchart of an illustrative process for generating a route to a destination, in accordance with some embodiments of the present disclosure.

FIG. 6 shows a flowchart of illustrative process 600 for generating a route to a destination, in accordance with some embodiments of the present disclosure. Process 600 may be performed at least in part by processing circuitry 102 and/or user device 138. As described above, process 600 is an alternative method of performing certain steps in process 400 described above in FIG. 4 (e.g., beginning with 410 of FIG. 4).

At 602, processing circuitry 102 may determine if electric battery 110 contains at least a predetermined percentage more than the energy required to reach the destination. By determining whether electric battery 110 contains at least a predetermined percentage more than the energy required to reach the destination, charging stations may be prevented from being unnecessarily added to a trip, even if the total SOC of electric battery 110 is low. In one example, the processing circuitry 102 may determine if electric battery 110 contains at least 115% of the energy required to reach the destination. In response to determining that electric battery 110 does not contain at least a predetermined percentage more than the energy required to reach the destination ("No" at 602), processing may proceed to 604. Otherwise ("Yes" at 602), processing may proceed to 606.

At 604, processing circuitry 102 may add a charging station to the route to the destination. For example, processing circuitry 102 may identify charging stations at a location along the route to the destination where electric battery 110 contains at least 115% of the energy required to reach the location. Processing may then return to 602 and determine if electric battery 110, after recharging, will have at least the predetermined percentage more than the energy required to reach the destination from the charging station.

At 606, processing circuitry 102 may determine if at least one charging station has been added to the trip. In response to determining that no charging stations have been added to the trip ("No" at 606), processing may proceed to 608. Otherwise ("Yes" at 606), processing may proceed to 610.

At 608, processing circuitry 102 may generate for presentation the route to the navigation destination without any suggested charting stations (e.g., on navigation interface 300). Navigation interface 300 (or any of the other interfaces described above) may be displayed at display 130 of electric vehicle 101 and/or at user device 138.

At 610, processing circuitry 102 may determine if the destination arrival SOC of electric battery 110 is at least equal to an arrival threshold level. In one example, the arrival threshold level may be 20% of the total capacity of electric battery 110. In response to determining that the arrival SOC of electric battery 110 is at least equal to the arrival threshold level ("Yes" at 610), processing may proceed to 612. Otherwise ("No" at 610), processing may proceed to 614.

At 612, processing circuitry 102 may generate for presentation the route to the destination with the added charging stations as waypoints and a default charging itinerary (e.g., on navigation interface 300). Navigation interface 300 (or any of the other interfaces described above) may be displayed at display 130 of electric vehicle 101 and/or at user device 138. In some embodiments, the default charging itinerary may include the charging times at each of the added charging stations to reach the default recharge SOC described above at 516 of FIG. 5.

At 614, processing circuitry 102 may determine if achieving an arrival SOC of at least the arrival threshold level would extend the trip duration by more than a trip threshold percentage. In one example, the trip threshold percentage may be 20% of the trip duration. In response to determining that the threshold level would not extend the trip duration by more than the trip threshold percentage ("No" at 614), processing may proceed to 616. Otherwise ("Yes" at 614), processing may proceed to 620.

At 616, processing circuitry 102 may adjust the default charging itinerary to achieve an arrival SOC of electric battery 110 equal to the arrival threshold. For example, processing circuitry may adjust the charging times at one or more of the added charging stations to achieve the desired arrival SOC of electric battery 110.

At 618, processing circuitry 102 may generate for presentation the route to the destination with the added charging stations as waypoints and the adjusted default charging itinerary (e.g., on navigation interface 300). Navigation interface 300 (or any of the other interfaces described above) may be displayed at display 130 of electric vehicle 101 and/or at user device 138.

At 620, processing circuitry 102 may adjust the default charging itinerary until the trip duration is extended by the trip threshold percentage. For example, in order to increase the arrival SOC of electric battery 110, processing circuitry may increase the charging time at one or more of the added charging stations, without extending the trip duration by more than the trip threshold percentage.

At 622, processing circuitry 102 may generate for presentation the route to the destination with the added charging stations as waypoints and the adjusted default charging itinerary (e.g., on navigation interface 300). Navigation interface 300 (or any of the other interfaces described above) may be displayed at display 130 of electric vehicle 101 and/or at user device 138.

The processes discussed above are intended to be illustrative and not limiting. One skilled in the art would appreciate that the steps of the processes discussed herein may be omitted, modified, combined and/or rearranged, and any additional steps may be performed without departing from the scope of the invention. For example, 506-510 may be performed for any charging station, regardless of whether it is the last charging station along the route before the destination.

The foregoing is merely illustrative of the principles of this disclosure, and various modifications may be made by those skilled in the art without departing from the scope of this disclosure. The above-described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations thereto and modifications thereof, which are within the spirit of the following claims.

What is claimed is:

1. A system, comprising:
   a display having a screen; and
   processing circuitry configured to:
      determine a partial range of an electric vehicle corresponding to a predetermined percentage of a current state of charge (SOC) of a battery of the electric vehicle;
      determine, based on a route to a destination, a first location corresponding to the partial range;
      select a first suggested charging station based on the first location corresponding to the partial range;
      determine, based on the route to the destination, a second location;
      select a second suggested charging station based on the second location;
      determine a first recharge time for charging at the first suggested charging station to reach the second suggested charging station with an intermediate arrival SOC of the battery;
      determine a second recharge time for charging at the second suggested charging station to reach the destination with a predetermined destination SOC of the battery greater than the intermediate arrival SOC of the battery; and
      display, on the screen of the display, a navigation interface that displays the route to a destination overlaid with the first suggested charging station with the corresponding first recharge time and the second suggested charging station with the corresponding second recharge time.

2. The system of claim 1, wherein the processing circuitry is further configured to:
   determine whether the destination is within the partial range; and
   in response to determining the destination is out of the partial range, perform (i) the determination of the first location corresponding to the partial range, (ii) the selection of the first suggested charging station, and (iii) the display, on the screen of the display, the first suggested charging station.

3. The system of claim 1, wherein the processing circuitry is further configured, when displaying the navigation interface that displays the route to the destination, to display the first suggested charging station with a first icon comprising the corresponding first recharge time and the second suggested charging station with a second icon comprising the corresponding second recharge time.

4. The system of claim 3, wherein:
   the predetermined percentage is 80%;
   the intermediate arrival SOC of the battery is 15% of a total capacity of the battery; and
   the predetermined destination SOC of the battery is 25% of the total capacity of the battery.

5. The system of claim 1, wherein the processing circuitry is further configured to retrieve route information of the route, and
   wherein the processing circuitry is further configured, when determining the partial range of the electric vehicle, to determine the partial range of the electric vehicle further based on the retrieved route information of the route.

6. The system of claim 5, wherein the retrieved route information of the route comprises at least one of weather information along the route, speed information along the route, traffic information along the route, or elevation change along the route.

7. The system of claim 1, wherein the processing circuitry is further configured, when displaying the navigation interface that displays the route to the destination, to display the route including the first and second suggested charging stations as waypoints.

8. The system of claim 1, wherein the processing circuitry is further configured, when selecting the first suggested charging station, to:
   search for charging stations within a predetermined distance from the first location corresponding to the partial range; and
   in response to identifying at least one charging station based on the searching, select the first suggested charging station from among the at least one charging station based on a distance of the at least one charging station from the first location corresponding to the partial range and attributes of the at least one charging station.

9. The system of claim 8, wherein the processing circuitry is further configured, in response to not identifying any charging station based on a result of the searching, to search for charging stations between a current location of the electric vehicle and the first location corresponding to the partial range and selecting a charging station closest to the first location corresponding to the partial range as the first suggested charging station.

10. The system of claim 1, wherein the processing circuitry is further configured to:
    determine an increase in charging time to reach the destination with the predetermined destination SOC; and
    in response to the increase exceeding a threshold, adjust the second recharge time to reach the destination with an SOC of the battery less than the predetermined destination SOC.

11. A method, comprising:
    determining a partial range of an electric vehicle corresponding to a predetermined percentage of a current state of charge (SOC) of a battery of the electric vehicle;
    determining, based on a route to a destination, a first location corresponding to the partial range;
    selecting a first suggested charging station based on the first location corresponding to the partial range;

determining, based on the route to the destination, a second location;

selecting a second suggested charging station based on the second location;

determining a first recharge time for charging at the first suggested charging station to reach the second suggested charging station with an intermediate arrival SOC of the battery;

determining a second recharge time for charging at the second suggested charging station to reach the destination with a predetermined destination SOC of the battery greater than the intermediate arrival SOC of the battery; and displaying, on a screen of a display, a navigation interface that displays the route to a destination overlaid with the first suggested charging station with the corresponding first recharge time and the second suggested charging station with the corresponding second recharge time.

12. The method of claim 11, further comprising:

determining whether the destination is within the partial range; and in response to determining the destination is out of the partial range, performing the determining the first location corresponding to the partial range, the selecting the first suggested charging station, and the displaying, on the screen of the display, the first suggested charging station.

13. The method of claim 11, wherein:

displaying the navigation interface that displays the route to the destination comprises displaying the first suggested charging station with a first icon comprising the corresponding first recharge time and the second suggested charging station with a second icon comprising the corresponding second recharge time.

14. The method of claim 13, wherein:

the predetermined percentage is 80%;

the intermediate arrival SOC of the battery is 15% of a total capacity of the battery; and the predetermined destination SOC of the battery is 25% of the total capacity of the battery.

15. The method of claim 11, further comprising:

retrieving route information of the route, and determining the partial range of the electric vehicle further based on the retrieved route information of the route.

16. The method of claim 11, further comprising:

determining an increase in charging time to reach the destination with the predetermined destination SOC; and in response to the increase exceeding a threshold, adjusting the second recharge time to reach the destination with an SOC of the battery less than the predetermined destination SOC.

17. A non-transitory computer-readable medium having non-transitory computer-readable instructions encoded thereon that, when executed by a processor, cause the processor to:

determine a partial range of an electric vehicle corresponding to a predetermined percentage of a current state of charge (SOC) of a battery of the electric vehicle;

determine whether a destination is within the partial range; and in response to determining that the destination is not within the partial range, determine, based on a route to a destination, a first location corresponding to the partial range;

select a first suggested charging station based on the first location corresponding to the partial range;

determine, based on the route to the destination, a second location;

select a second suggested charging station based on the second location;

determine a first recharge time for charging at the first suggested charging station to reach the second suggested charging station with an intermediate arrival SOC of the battery;

determine a second recharge time for charging at the second suggested charging station to reach the destination with a predetermined destination SOC of the battery greater than the intermediate arrival SOC of the battery; and display, on a screen of a display, a navigation interface that displays the route to a destination overlaid with the first suggested charging station with the corresponding first recharge time and the second suggested charging station with the corresponding second recharge time.

18. The non-transitory computer-readable medium of claim 17, wherein the instructions, when executed by the processor, further cause the processor, when displaying the navigation interface that displays the route to the destination, to:

display the first suggested charging station with a first icon comprising the corresponding first recharge time and the second suggested charging station with a second icon comprising the corresponding second recharge time.

19. The non-transitory computer-readable medium of claim 17, wherein the instructions, when executed by the processor, further cause the processor, when displaying the navigation interface that displays the route to the destination, to display the route including the first and second suggested charging stations as waypoints.

20. The non-transitory computer-readable medium of claim 17, wherein the instructions, when executed by the processor, further cause the processor to:

determine an increase in charging time to reach the destination with the predetermined destination SOC; and in response to the increase exceeding a threshold, adjust the second recharge time to reach the destination with an SOC of the battery less than the predetermined destination SOC.

* * * * *